(12) United States Patent
Fan et al.

(10) Patent No.: US 10,488,472 B2
(45) Date of Patent: Nov. 26, 2019

(54) METHOD AND SYSTEM FOR EVALUATING MAGNETIC FIELD UNIFORMITY OF MAGNETIC COIL

(71) Applicant: Sichuan Energy Internet Research Institute, Tsinghua University, Chengdu, Sichuan (CN)

(72) Inventors: Jun Fan, Rolla, MO (US); Siming Pan, San Jose, CA (US); Dawei He, Burlingame, CA (US); Yi Liu, Chengdu (CN); Jingdong Sun, Rolla, MO (US)

(73) Assignee: SICHUAN ENERGY INTERNET RESEARCH INSTITUTE, TSINGHUA UNIVERSITY, Chengdu (CN)

( * ) Notice: Subject to any disclaimer, the term of this patent is extended or adjusted under 35 U.S.C. 154(b) by 111 days.

(21) Appl. No.: 15/635,882

(22) Filed: Jun. 28, 2017

(65) Prior Publication Data
US 2019/0004125 A1 Jan. 3, 2019

(51) Int. Cl.
*G01R 33/12* (2006.01)
*G01R 33/02* (2006.01)
*G01R 33/10* (2006.01)

(52) U.S. Cl.
CPC ............. *G01R 33/12* (2013.01); *G01R 33/02* (2013.01); *G01R 33/10* (2013.01)

(58) Field of Classification Search
CPC .......... G01R 33/02; G01R 33/12; G01R 33/10
See application file for complete search history.

(56) References Cited

U.S. PATENT DOCUMENTS

| | | | | |
|---|---|---|---|---|
| 6,084,412 A | * | 7/2000 | Guo | G01V 3/15 324/239 |
| 9,853,837 B2 | * | 12/2017 | Krause | H04B 5/0075 |

* cited by examiner

*Primary Examiner* — Bryan Bui
(74) *Attorney, Agent, or Firm* — Sheppard, Mullin, Richter & Hampton LLP (57) ABSTRACT

A method for evaluating a uniformity of a magnetic field generated by a magnetic coil is disclosed. The method may include providing an electrical current to the magnetic coil to generate a magnetic field; scanning and obtaining a set of signals of the magnetic field by moving a measurement probe of a scanning tool point by point within a scanning region of the magnetic field and at a scanning height; performing a spectrum analysis on the set of signals by a spectrum analyzer to extract spectrum information of the magnetic field; transferring the set of signals and the extracted spectrum information to a computer system; selecting signals of the magnetic field with one or more frequencies from the set of signals based on the extracted spectrum information by the computer system; and analyzing the uniformity of the magnetic field by analyzing the selected signals by the computer system.

14 Claims, 5 Drawing Sheets

METHOD AND SYSTEM FOR EVALUATING MAGNETIC FIELD UNIFORMITY OF MAGNETIC COIL

TECHNICAL FIELD

The disclosure relates generally to a wireless charging system, particularly, to a method and system for evaluating magnetic field uniformity of a magnetic coil in a wireless charging system.

BACKGROUND

Wireless charging is an evolving technology that may bring a new level of convenience of charging electronic devices. In a wireless charging system, particularly an inductive wireless charging system, energy is transferred from one or more power transmitter (TX) coils to one or more power receiver (RX) coils through a coupling of a magnetic field.

A magnetic coil can generate a magnetic field, and the coupling of the magnetic field between TX and RX coils is influenced by the alignment of the coils. A good alignment generally leads to a good coupling, which is critical to a high-efficient power transfer. When there is an offset in the alignment, the coupling may be negatively affected. A magnetic coil with a high uniformity of magnetic field may overcome the negative effect brought by the offset, and maintain a good coupling between the TX and RX coils, thus, maintain a high-efficient power transfer.

To improve user experiences and increase the charging efficiency, it is desirable to have a magnetic coil with a high magnetic field uniformity, so that users can leave one or more RX devices freely on the TX surface in any location or direction to charge. This disclosure proposes a method and system for evaluating the magnetic field uniformity of a magnetic coil in a wireless charging system.

SUMMARY

One aspect of the present disclosure is directed to a method for evaluating uniformity of a magnetic field generated by a magnetic coil. The method may include providing an electrical current to the magnetic coil to generate a magnetic field; scanning and obtaining a set of signals of the magnetic field by moving a measurement probe of a scanning tool point by point within a scanning region of the magnetic field; performing a spectrum analysis on the set of signals by a spectrum analyzer to extract spectrum information of the magnetic field at a scanning height; transferring the set of signals and the extracted spectrum information to a computer system; selecting signals of the magnetic field with one or more frequencies from the set of signals based on the extracted spectrum information by the computer system; and analyzing the uniformity of the magnetic field by analyzing the selected signals by the computer system.

Another aspect of the present disclosure is directed to a method for analyzing uniformity of a measured magnetic field generated by a magnetic coil. The method may include defining a target charging area of the magnetic field; obtaining a maximum magnetic field magnitude $H_{max}$ and a minimum magnetic field magnitude $H_{min}$ within the target charging area; obtaining a maximum gradient of the magnetic field in an x-direction $$\frac{\partial H(x_1, y_1)}{\partial x}$$

at a first position $(x_1, y_1)$, and a maximum gradient of the magnetic field in a y-direction $$\frac{\partial H(x_2, y_2)}{\partial y}$$

at a second position $(x_2, y_2)$; and determining the uniformity of the magnetic field by determining values of $$\frac{H_{max} - H_{min}}{H_{max}} \text{ and } \sqrt{\left[\frac{\partial H(x_1, y_1)}{\partial x}\right]^2 + \left[\frac{\partial H(x_2, y_2)}{\partial y}\right]^2}.$$

The gradient of the magnetic field may be defined as $$\nabla H(x, y) = \hat{x}\frac{\partial H(x, y)}{\partial x} + \hat{y}\frac{\partial H(x, y)}{\partial y}.$$

Another aspect of the present disclosure is directed to a system for evaluating uniformity of a magnetic field generated by a magnetic coil. The system may include a scanning tool, a spectrum analyzer and a computer system. The scanning tool may be configured to scan and obtain a set of signals of the magnetic field by moving a measurement probe point by point within a scanning region and at a scanning height. The spectrum analyzer may be configured to extract spectrum information of the set of the signals by performing a spectrum analysis. The computer system may be configured to select signals of the magnetic field with one or more frequencies from the set of signals based on the extracted spectrum information, and analyze the uniformity of the magnetic field by evaluating the selected signals.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this disclosure, illustrate several non-limiting embodiments and, together with the description, serve to explain the disclosed principles.

DETAILED DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention.

Figure 1:
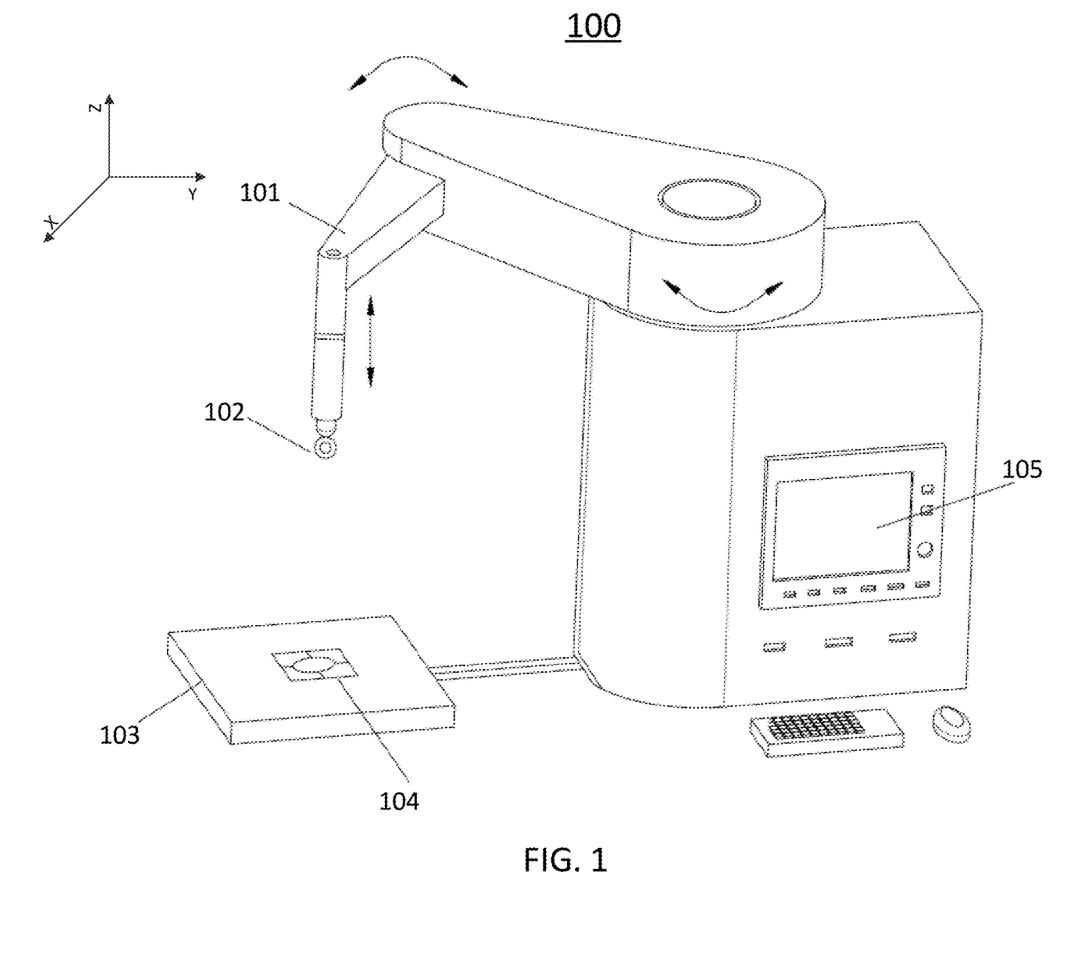
FIG. 1 is a graphical representation illustrating a near-field scanning tool, consistent with exemplary embodiments of the present disclosure.

The evaluation of a magnetic field generated by a magnetic coil may include a magnetic field measurement and a measurement result analysis. By using a near-field scanning tool, the magnetic field of a magnetic coil may be measured. FIG. 1 shows a near-field scanning tool 100, consistent with exemplary embodiments of the present disclosure. The tool 100 may comprise a number of components, some of which may be optional. In some embodiments, the tool 100 may include many more components than those shown in FIG. 1. However, it is not necessary that all of these components be shown in order to disclose an illustrative embodiment.

The tool 100 may include a probe arm 101, a measurement probe 102, a testing plane 103, one or more device-under-test (DUT) clamp 104, and a controller computer 105.

The probe arm 101 may include several motors, and sliding guides in the x, y and z directions. The probe arm 101 may be configured to hold and rotate the measurement probe 102 in a [−180, 180] degree range. The measurement probe 102 may move along the x, y and z directions and reach different positions.

The measurement probe 102 may have different types. In one embodiment, the probe 102 is a magnetic field (H-field) strength probe that can detect magnitude and frequency of the magnetic field. In another embodiment, the probe 102 is a H-field phase probe that can detect phase information of the magnetic field. The probe 102 may also differ in frequency ranges, H-field sensitivity levels, etc. Based on testing scenarios and requirements, a specific measurement probe can be selected.

The testing plane 103 may be a flat plane that is horizontally positioned with the surface of the plane parallel to the ground, and is also parallel to the x-y plane. One or more DUT clamp 104 may be installed on the testing plane 103, and may be used to secure the DUT during measurement.

The controller computer 105 may be configured to connect the probe arm 101 and the testing plate 103. The controller computer 105 may control the probe arm 101 by driving the motors on the sliding guides. The controller computer 105 may also provide a user-friendly interface and software programs to control the measurement process and analyze the measurement results.

Figure 2:
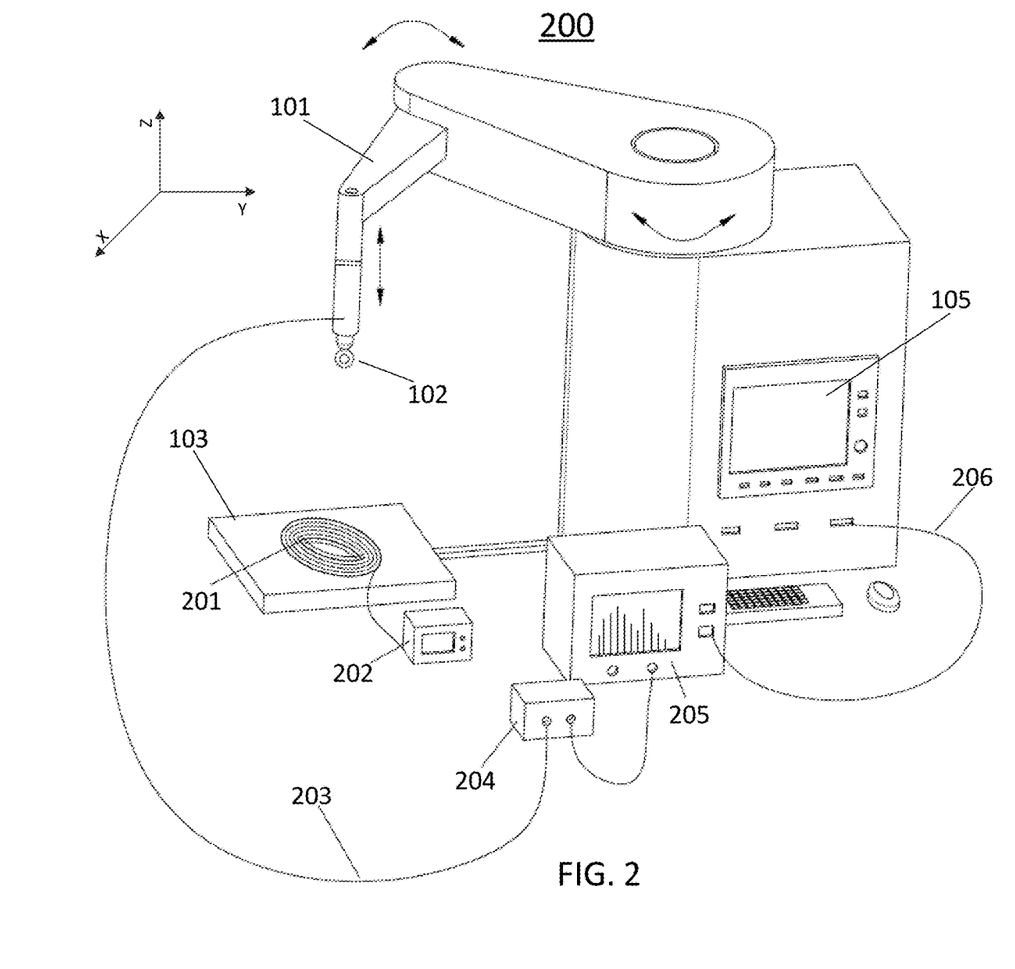
FIG. 2 is a graphical representation illustrating a measurement system for evaluating a magnetic field uniformity of a magnetic coil, consistent with exemplary embodiments of the present disclosure.

FIG. 2 shows a measurement system 200 with a magnetic coil placed in the near-field scanning tool, consistent with exemplary embodiments of the present disclosure. The measurement system 200 may comprise a number of components, some of which may be optional. In some embodiments, the measurement system 200 may include many more components than those shown in FIG. 2. However, it is not necessary that all of these components be shown in order to disclose an illustrative embodiment.

In addition to the near-field scanning tool, the measurement system 200 may also include a DUT 201, a feeding power supply 202, a cable 203, an amplifier 204, a measurement instrument 205 and another cable 206. Cable 206 can be a USB cable, a general purpose interface bus (GPIB) cable, or an Ethernet cable.

The DUT 201 may be a magnetic coil, and may be secured by the DUT clamp 104. In some embodiments, the DUT 201 may be a TX coil. The DUT 201 may be configured to couple with the feeding power supply 202. The feeding power supply 202 may be configured to supply power, e.g., an electrical current, to the DUT 201. In some embodiments, there may be a power amplifier circuit configured to couple with the DUT 201 and the feeding power supply 202. The cable 203 may be a 50 Ohm coaxial cable, and may be configured to connect the measurement probe 101 and the amplifier 204.

The measurement instrument 205 may be a spectrum analyzer. It may be configured to receive measurement signals from the amplifier 204. The measurement instrument 205 may also be configured to connect with the controller computer 105 through the cable 206. The controller computer 105 may send controlling commands to the measurement instrument 205, and the measurement instrument 205 may deliver measurement results to the controller computer 105. In some other embodiments, the measurement system 200 may include a separate computer system that is connected with the measurement instrument 205 and that is used to receive and analyze the measure results.

The measurement instrument 205 may be different depending on the measurement requirements. In some embodiments, the measurement instrument 205 may be a vector network analyzer for measuring phase information.

Figure 3:
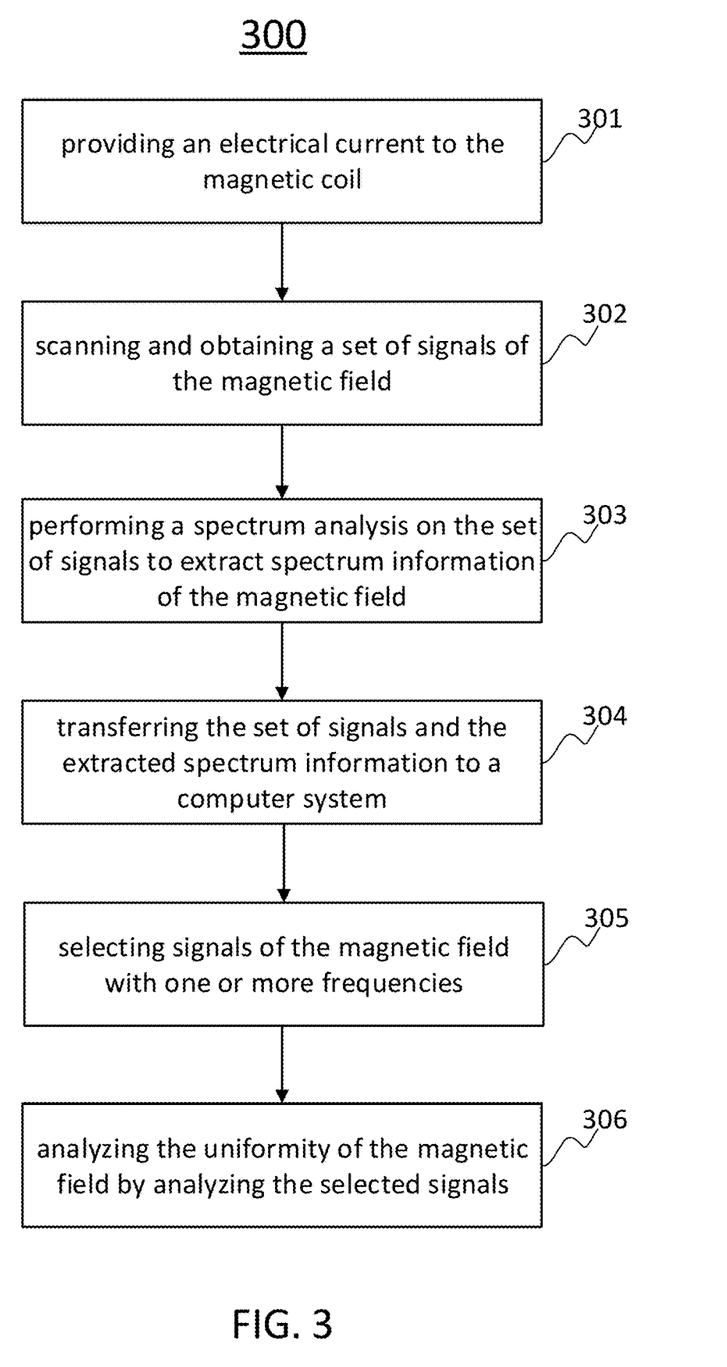
FIG. 3 is a flow diagram illustrating a method for measuring a magnetic field generated by a magnetic coil, consistent with exemplary embodiments of the present disclosure.

FIG. 3 is a flow diagram illustrating a method 300 for measuring a magnetic field of a magnetic coil by a near-filed scanning tool, consistent with exemplary embodiments of the present disclosure.

A measurement system, for example, the measurement system 200 shown in FIG. 2, is prepared. A magnetic coil may be placed on the testing plane, and may be secured by one or more DUT clamps. In some embodiments, the magnetic coil may be a TX coil. At step 301, the magnetic coil may be powered by the feeding power supply. A measurement probe may be selected and mounted on the probe arm. The output of the measurement probe may be configured to connect to the input of the amplifier, and the output of the amplifier may be configured to connect to a port of the spectrum analyzer. The spectrum analyzer may be configured to connect to the controller computer, and the computer may read signals or data from the spectrum analyzer.

Measurement conditions may be initialized. The measurement conditions may include a scanning region, a scanning height, etc. A scanning region is an area in the x-y plane, which is parallel to the surface of the testing plane. The measurement probe may move within this scanning region to collect signals during the measurement. The scanning height is a distance between the measurement probe and the magnetic coil in the z-direction, and may be set to be the same as a charging distance in a wireless charging system. A charging distance may be a vertical distance between the centers of a TX coil and a RX coil when they are in use for charging a RX device, and a typical value of the charging distance may be around 5 mm. In some embodiments, "vertical" may refer to a direction that is perpendicular to the plane of a TX or RX coil. The measurement probe may move around in the x, y and z directions and detect signals of the magnetic field to initialize the measurement conditions.

At step 302, within the scanning region and at the scanning height, a set of signals of the magnetic field may be obtained by scanning the scanning region, for example, by moving the measurement probe from point to point. The process of the measurement may be controlled by a scanning software program installed in the controller computer.

The magnetic field generated by the magnetic coil may include different frequencies, such as 100 kHz, 6.78 MHz, etc. At step 303, the obtained set of signals may be transferred to the spectrum analyzer. The spectrum analyzer may perform a spectrum analysis on the magnetic field, and extract spectrum information of the magnetic field.

At step 304, the set of signals and the extracted spectrum information may be transferred to the controller computer.

At step 305, signals with one or more frequencies may be selected from the set of signals based on the extracted spectrum information by the controller computer. One example of the selected frequency of the magnetic field may be 100 kHz. The selected frequency may be a frequency the magnetic coil operates when it is used in wireless charging. In some embodiments, the controller computer may plot the magnetic field in a (x, y) coordinate within the scanning region based on the selected signals.

At step 306, the uniformity of the magnetic field may be analyzed by analyzing the selected signals by the controller computer. The detailed method of analyzing the uniformity of the magnetic field is presented below.

Figure 4:
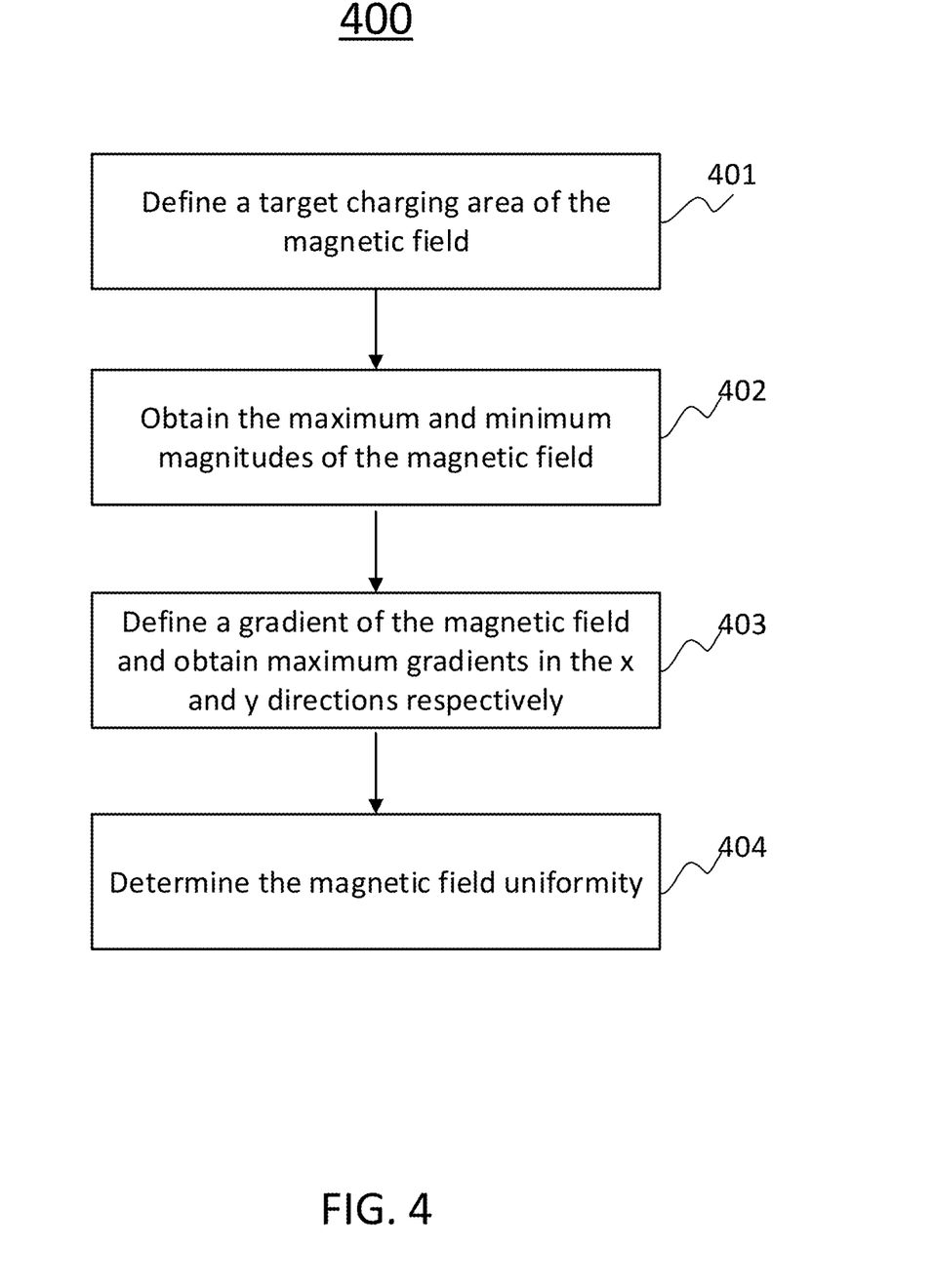
FIG. 4 is a flow diagram illustrating a method for analyzing a uniformity of the magnetic field generated by a magnetic coil, consistent with exemplary embodiments of the present disclosure.

FIG. 4 is a flow diagram illustrating a method 400 for analyzing a uniformity of the magnetic field generated by a magnetic coil, consistent with exemplary embodiments of the present disclosure.

At step 401, a target charging area may be defined by a user, and the magnetic field inside the target charging area may be selected for the uniformity analysis, and the corresponding analysis result may be used to characterize the magnetic field uniformity of the magnetic coil. For different shape magnetic coils, the charging area may be different. For example, for a circular magnetic coil, the target charging area may be a circular area with a center coincident with the center of the magnetic coil, but with a smaller diameter.

The strength of a magnetic field may be characterized by its magnitude. At a position (x, y), the magnitude of the magnetic field can be denoted as H (x, y). At step 402, within the target charging area, with the selected frequency, a maximum magnetic field magnitude may be obtained and denoted as $H_{max}$. Similarly, a minimum magnetic field magnitude may be obtained and denoted as $H_{min}$.

At step 403, a gradient of the magnetic field within the target charging area and with the selected frequency, can be denoted as $\nabla H(x, y)$. It may be defined as:

$$\nabla H(x, y) = \hat{x}\frac{\partial H(x, y)}{\partial x} + \hat{y}\frac{\partial H(x, y)}{\partial y}.$$

Since the magnetic field is a vector field, i.e., a field has directions, the gradient of the magnetic field include components in both the x and y directions. Here, $$\frac{\partial H(x, y)}{\partial x}$$

stands for the directional derivative of H in the x-direction ($\hat{x}$), and $$\frac{\partial H(x, y)}{\partial y}$$

stands for the directional derivative of H in the y-direction ($\hat{y}$). A maximum gradient of the magnetic field in the x-direction may be located at $(x_1, y_1)$, and defined as $$\frac{\partial H(x_1, y_1)}{\partial x}.$$

Similarly, a maximum gradient of the magnetic field in the y-direction may be located at $(x_2, y_2)$, and defined as $$\frac{\partial H(x_2, y_2)}{\partial y}.$$

At step 404, the uniformity of the magnetic field generated by a magnetic coil may be determined by checking values of $$\frac{H_{max} - H_{min}}{H_{max}} \text{ and } \sqrt{\left[\frac{\partial H(x_1, y_1)}{\partial x}\right]^2 + \left[\frac{\partial H(x_2, y_2)}{\partial y}\right]^2}.$$

When the calculation results satisfy $$\frac{H_{max} - H_{min}}{H_{max}} \leq 0.25, \text{ and } \sqrt{\left[\frac{\partial H(x_1, y_1)}{\partial x}\right]^2 + \left[\frac{\partial H(x_2, y_2)}{\partial y}\right]^2} < 1.0$$

at the same time, the uniformity of the magnetic field is considered as acceptable. Otherwise, the magnetic field uniformity of the magnetic coil may be not acceptable.

In addition, the calculation results of $$\frac{H_{max} - H_{min}}{H_{max}} \text{ and } \sqrt{\left[\frac{\partial H(x_1, y_1)}{\partial x}\right]^2 + \left[\frac{\partial H(x_2, y_2)}{\partial y}\right]^2}$$

may indicate the level of magnetic field uniformity. The lower values of the calculation results may indicate a higher level of uniformity. Accordingly, the two values may be used to compare the levels of magnetic field uniformity among different magnetic coils. The magnetic coil with minimum values of the two calculation results may have the highest level of magnetic field uniformity.

Figure 5:
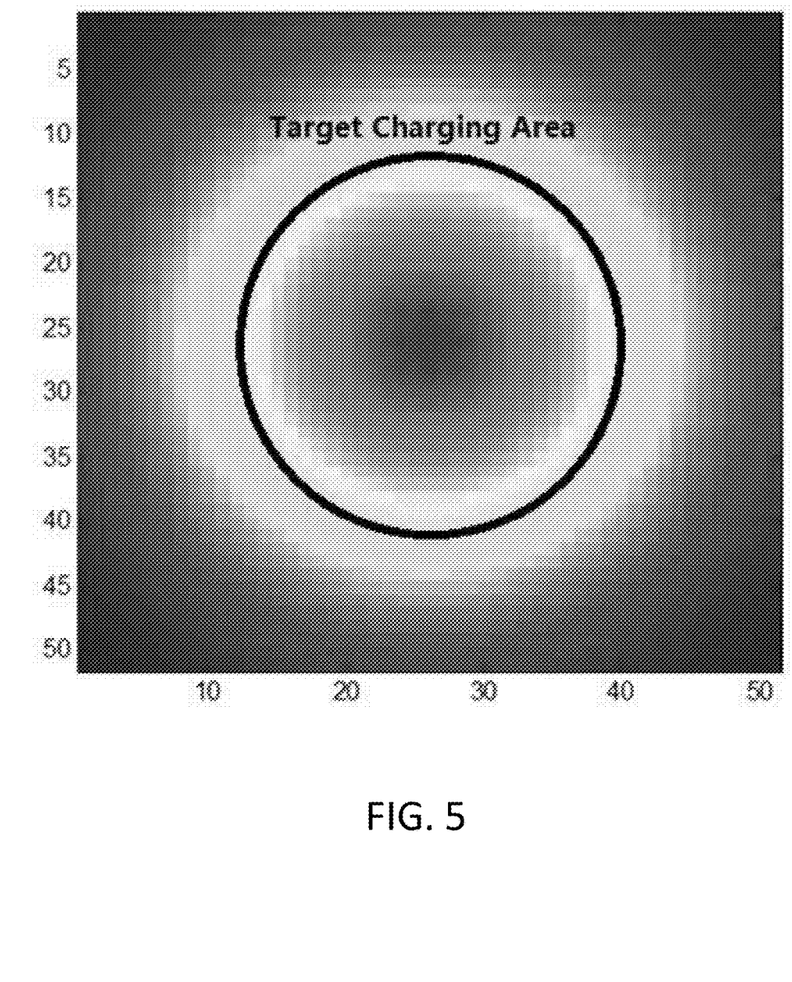
FIG. 5 is an image of a magnetic field measurement result of an exemplary magnetic coil, consistent with exemplary embodiments of the present disclosure.

FIG. 5 shows a magnetic field measurement result of an exemplary magnetic coil. The scanning region is a 50 mm×50 mm area, and FIG. 5 illustrates the magnetic field strength within this scanning region. The magnetic coil is placed at the position (25 mm, 25 mm), where the magnetic field shows its maximum strength. The target charging area is a circular area with its center at (25 mm, 25 mm) and its radius is 13 mm, as outlined by a circle in FIG. 5. Within the target charging area, the maximum field magnitude is identified as $H_{max}$=44, and the minimum field magnitude is identified as $H_{min}$=33. To analyze the magnetic field uniformity, the following calculation results can be obtained:

$$\frac{H_{max} - H_{min}}{H_{max}} = 0.25$$

$$\sqrt{\left[\frac{\partial H(x,y)}{\partial x}\right]^2 + \left[\frac{\partial H(x,y)}{\partial y}\right]^2} = 0.85 < 0.1 \qquad 5$$

Accordingly the uniformity of the magnetic field of this exemplary magnetic coil can be considered as acceptable.

The invention described and claimed herein is not to be limited in scope by the specific preferred embodiments disclosed herein, as these embodiments are intended as illustrations of several aspects of the invention. Indeed, various modifications of the invention in addition to those shown and described herein will become apparent to those skilled in the art from the foregoing description. Such modifications are also intended to fall within the scope of the appended claims.

What is claimed is:

1. A method for evaluating uniformity of a magnetic field generated by a magnetic coil, comprising:
    providing an electrical current to the magnetic coil to generate the magnetic field;
    scanning and obtaining a set of signals of the magnetic field by moving a measurement probe of a scanning tool point by point within a scanning region of the magnetic field at a scanning height;
    performing a spectrum analysis on the set of signals by a spectrum analyzer to extract spectrum information of the magnetic field;
    transferring the set of signals and the extracted spectrum information to a computer system;
    selecting signals of the magnetic field with one or more frequencies from the set of signals based on the extracted spectrum information by the computer system; and
    analyzing the uniformity of the magnetic field by analyzing the selected signals by the computer system;
    wherein analyzing the uniformity of the magnetic field comprises:
    defining a target charging area of the magnetic field;
    obtaining a maximum magnetic field magnitude $H_{max}$ and a minimum magnetic field magnitude $H_{min}$ within the target charging area;
    obtaining a maximum gradient of the magnetic field in an x-direction $$\frac{\partial H(x_1, y_1)}{\partial x}$$

at a first location $(x_1, y_1)$, and a maximum gradient of the magnetic field in a y-direction $$\frac{\partial H(x_2, y_2)}{\partial y}$$

at a second location $(x_2, y_2)$, where a gradient of the magnetic field is defined as $$\nabla H(x, y) = \hat{x}\frac{\partial H(x, y)}{\partial x} + \hat{y}\frac{\partial H(x, y)}{\partial y};$$

and
    determining the uniformity of the magnetic field based on the values of $$\frac{H_{max} - H_{min}}{H_{max}} \text{ and } \sqrt{\left[\frac{\partial H(x_1, y_1)}{\partial x}\right]^2 + \left[\frac{\partial H(x_2, y_2)}{\partial y}\right]^2}.$$

2. The method of claim 1, wherein the magnetic coil is a power transmitter coil.

3. The method of claim 1, further comprising plotting the selected signals of the magnetic field in a (x, y) plane.

4. The method of claim 1, further comprising amplifying the set of signals by an amplifier and providing the amplified signals to the spectrum analyzer.

5. The method of claim 1, wherein:
    the scanning region is an area in an x-y plane, which is parallel to a surface of a testing plane of the scanning tool; and
    the scanning height is the same as a charging distance which is a vertical distance between centers of the magnetic coil and another magnetic coil when they are in use for wireless charging.

6. The method of claim 5, wherein the charging distance is 5 mm.

7. The method of claim 1, further comprising determining whether $$\frac{H_{max} - H_{min}}{H_{max}} \leq 0.25,$$

and whether $$\sqrt{\left[\frac{\partial H(x_1, y_1)}{\partial x}\right]^2 + \left[\frac{\partial H(x_2, y_2)}{\partial y}\right]^2} < 1.0,$$

and if the value of $$\frac{H_{max} - H_{min}}{H_{max}}$$

is no more than 0.25 and the value of $$\sqrt{\left[\frac{\partial H(x_1, y_1)}{\partial x}\right]^2 + \left[\frac{\partial H(x_2, y_2)}{\partial y}\right]^2}$$

is no more than 1.0, determining that the uniformity of the magnetic field as acceptable.

8. The method of claim 1, further comprising determining that a magnetic field with a smaller value of $$\frac{H_{max} - H_{min}}{H_{max}}$$

has a higher level of uniformity.

9. The method of claim 1, further comprising determining that a magnetic field with a smaller value of $$\sqrt{\left[\frac{\partial H(x_1, y_1)}{\partial x}\right]^2 + \left[\frac{\partial H(x_2, y_2)}{\partial y}\right]^2}$$

has a higher level of uniformity.

10. A system for evaluating uniformity of a magnetic field generated by a magnetic coil, comprising:
- a scanning tool configured to scan and obtain a set of signals of the magnetic field by moving a measurement probe point by point within a scanning region and at a scanning height;
- a spectrum analyzer configured to extract spectrum information of the set of the signals by performing a spectrum analysis, and to transfer the set of signals and the extracted spectrum information to a computer system; and
- the computer system configured to select signals of the magnetic field with one or more frequencies from the set of signals based on the extracted spectrum information, and analyze the uniformity of the magnetic field by analyzing the selected signals;
- wherein to analyze the uniformity of the magnetic field by analyzing the selected signals, the computer system is further configured to:
- obtain a maximum magnetic field magnitude $H_{max}$ and a minimum magnetic field magnitude $H_{min}$ within the target charging area;
- obtain a maximum gradient of the magnetic field in an x-direction $$\frac{\partial H(x_1, y_1)}{\partial x}$$

at a first location ($x_1$, $y_1$), and a maximum gradient of the magnetic field in a y-direction $$\frac{\partial H(x_2, y_2)}{\partial y}$$

at a second location ($x_2$, $y_2$), where a gradient of the magnetic field is defined as $$\Delta H(x, y) = \hat{x}\frac{\partial H(x, y)}{\partial x} + \hat{y}\frac{\partial H(x, y)}{\partial y};$$

and
determine the uniformity of the magnetic field based on the values of $$\frac{H_{max} - H_{min}}{H_{max}} \text{ and } \sqrt{\left[\frac{\partial H(x_1, y_1)}{\partial x}\right]^2 + \left[\frac{\partial H(x_2, y_2)}{\partial y}\right]^2}.$$

11. The system of claim 10, further comprising:
- a feeding power supply configured to provide an electrical current to the magnetic coil; and
- an amplifier configured to amplify the set of signals of the magnetic field.

12. The system of claim 10, wherein to analyze the uniformity of the magnetic field by analyzing the selected signals, the computer system is further configured to determine whether $$\frac{H_{max} - H_{min}}{H_{max}} \leq 0.25,$$

and whether $$\sqrt{\left[\frac{\partial H(x_1, y_1)}{\partial x}\right]^2 + \left[\frac{\partial H(x_2, y_2)}{\partial y}\right]^2} < 1.0,$$

and if both are true, determine that the uniformity of the magnetic field as acceptable.

13. The system of claim 10, wherein to analyze the uniformity of the magnetic field by analyzing the selected signals, the computer system is further configured to determine that a magnetic field with a smaller value of $$\frac{H_{max} - H_{min}}{H_{max}}$$

has a higher level of uniformity.

14. The system of claim 10, wherein to analyze the uniformity of the magnetic field by analyzing the selected signals, the computer system is further configured to determine that a magnetic field with a smaller value of $$\sqrt{\left[\frac{\partial H(x_1, y_1)}{\partial x}\right]^2 + \left[\frac{\partial H(x_2, y_2)}{\partial y}\right]^2}$$

has a higher level of uniformity.

* * * * *

UNITED STATES PATENT AND TRADEMARK OFFICE
CERTIFICATE OF CORRECTION

PATENT NO. : 10,488,472 B2
APPLICATION NO. : 15/635882
DATED : November 26, 2019
INVENTOR(S) : Jun Fan et al.

Page 1 of 1

It is certified that error appears in the above-identified patent and that said Letters Patent is hereby corrected as shown below:

In the Claims

Claim 10, Column 9, Line 48:
"$\Delta$" should read -- $\nabla$ --.

Signed and Sealed this
Tenth Day of March, 2020

Andrei Iancu
*Director of the United States Patent and Trademark Office*